United States Patent
Wu et al.

(10) Patent No.: US 8,324,722 B2
(45) Date of Patent: Dec. 4, 2012

(54) PACKAGING DEVICE FOR MATRIX-ARRAYED SEMICONDUCTOR LIGHT-EMITTING ELEMENTS OF HIGH POWER AND HIGH DIRECTIVITY

(75) Inventors: Cheng Ju Wu, Jhubei (TW); Hung-Che Chen, Yongkang (TW); I Han Wu, Dali (TW); Shang-Cheng Liu, Jhubei (TW); Jin Shan Pan, Hsinchu (TW)

(73) Assignee: Truelight Corporation (TW)

( * ) Notice: Subject to any disclaimer, the term of this patent is extended or adjusted under 35 U.S.C. 154(b) by 274 days.

(21) Appl. No.: 12/657,161

(22) Filed: Jan. 14, 2010

(65) Prior Publication Data

US 2011/0121323 A1    May 26, 2011

(30) Foreign Application Priority Data

Nov. 26, 2009  (TW) ............................... 98222104 U

(51) Int. Cl.
*H01L 23/12*    (2006.01)

(52) U.S. Cl. ..... 257/700; 257/80; 257/99; 257/E33.056; 257/E33.075

(58) Field of Classification Search ............ 257/E33.075
See application file for complete search history.

(56) References Cited

U.S. PATENT DOCUMENTS

| | | | |
|---|---|---|---|
| 2006/0094137 A1* | 5/2006 | Yan ................................ | 438/21 |
| 2007/0200130 A1* | 8/2007 | Behringer et al. .............. | 257/99 |
| 2009/0311811 A1* | 12/2009 | Oh et al. ........................ | 438/28 |

* cited by examiner

*Primary Examiner* — Daniel Whalen

(57) ABSTRACT

A packaging device for matrix-arrayed semiconductor light-emitting elements of high power and high directivity comprises a metal base, an array chip and a plurality of metal wires. The metal base is of highly heat conductive copper or aluminum, and a first electrode area and at least one second electrode area which are electrically isolated are disposed on the metal base. The array chip is disposed on the first electrode area, on which multiple matrix-arranged semiconductor light-emitting elements and at least one wire bond pad adjacent to the light-emitting elements are disposed. The light-emitting element is a VCSEL element, an HCSEL element or an RCLED element. The metal wires are connected between the wire bond pad and the second electrode area to transmit power signals. Between the bottom surface and the first electrode area is disposed a conductive adhesive to bond and facilitate electrical connection between the two.

14 Claims, 3 Drawing Sheets

PACKAGING DEVICE FOR MATRIX-ARRAYED SEMICONDUCTOR LIGHT-EMITTING ELEMENTS OF HIGH POWER AND HIGH DIRECTIVITY

BACKGROUND OF INVENTION

1. Field of the Invention

The present invention is related to a packaging device for matrix-arrayed semiconductor light-emitting elements of high power and high directivity, and particularly to a packaging device which comprises an array chip furnished with a plurality of semiconductor light-emitting elements arranged in an array, and is designed with specific wire bonding structure for providing good heat dissipation.

2. Description of the Prior Art

In recent years, optical communication technology has progressively become the choice framework for network infrastructure, and is becoming the main trend of data transmissions in the foreseeable future. To increase optical transmission efficiency, various semiconductor lasers such as VCSELs (Vertical Cavity Surface Emitting Lasers), HCSELs (Horizontal Cavity Surface Emitting Lasers) and RCLEDs (Resonant Cavity Light Emitting Diodes) have become the focal point of research and development efforts within the industry.

Conventional semiconductor lasers such as VCSELs are packaged by use of a traditional TO-Can (Transistor-Outline-Can), for example, the TO-46 type, wherein the semiconductor laser chip is adhered to the nickel-iron alloy substrate using colloidal silver (epoxy). However, a massive amount of heat is produced as a result of increased output power by including multiple matrix-arranged laser elements on a single semiconductor laser chip. Due to poor heat dissipating capabilities of the nickel-iron alloy substrate and colloidal silver used by conventional semiconductor laser packaging device, overheating is likely to happen, preventing the power operation from upgrading to a watt-level.

Furthermore, the current number of laser elements disposed on a single semiconductor laser chip has reached up to 256 (16×16). In conventional packaging devices, the semiconductor laser chip is connected to the single electrode stem via wire bonding. However, in such conventional packaging devices, some metal wires are forced to traverse over the semiconductor laser chip, blocking light emitted by some laser elements. In addition, connecting all the gold wires to a single electrode stem will cause problems such as high resistance, high heat production and poor heat dissipation, therefore requiring improvements.

SUMMARY OF INVENTION

The primary objective of the present invention is to provide a packaging device for matrix-arrayed semiconductor light-emitting elements of high power and high directivity for resolving issues in the areas of wire bonding and heat dissipation.

In order to achieve the aforementioned objective, the present invention discloses a packaging device for matrix-arrayed semiconductor light-emitting elements of high power and high directivity. The packaging device comprises a metal base, an array chip and a plurality of metal wires. The metal base is of highly heat conductive copper or aluminum, and a first electrode area and at least one second electrode area which are electrically isolated are disposed on the metal base. The array chip is disposed on the first electrode area, on which multiple matrix-arranged semiconductor light-emitting elements and at least one wire bond pad adjacent to the light-emitting elements are disposed. The light-emitting element is a VCSEL element, an HCSEL element or an RCLED element. The metal wires are connected between the wire bond pad and the second electrode area to transmit power signals. Between the bottom surface and the first electrode area is disposed a conductive adhesive to bond and facilitate electrical connection between the two. The present invention adopts a metal substrate comprised of copper, aluminum or gold, and uses a conductive adhesive with good heat conductivity, such as solder paste, to adhere an array chip. Compared to conventional technology where nickel-iron alloy substrates and colloidal silver adhesion are employed, the present invention achieves superior heat conduction and dissipation effects. In addition, with the design structure of the wire bond pad and electrode areas of the present invention, more metal wiring is allowed to transmit power signals, therefore providing advantages such as better heat dissipation, shunted currents, reduced resistance, easy and flexible layout design, and reduced heat production, especially suitable for high power operated semiconductor light emitting elements packaging device.

In a preferred embodiment, the light-emitting elements are arranged as a tetragon and the number of the wire bond pads is at least two and distributed on different sides of the tetragon.

In a preferred embodiment, the number of the second electrode area is one and a width thereof is larger than a width of the array chip.

In a preferred embodiment, the number of the second electrode area is at least two and corresponds in position to the wire bond pads.

In a preferred embodiment, at least one second electrode area among the second electrode areas is an L-shaped structure located at a corner of the array chip.

In a preferred embodiment, at least one third electrode area is further disposed on the metal base.

In a preferred embodiment, the number of the at least one third electrode area is at least two, and at least one thereof is an L-shaped structure located at a corner of the array chip while the third electrode areas and the first electrode area are electrically connected via a plurality of metal wires.

In a preferred embodiment, the packaging device further comprises a circuit board. The metal base is embedded on the circuit board, and the circuit board is an LTCC substrate, an HTCC substrate or a plastic substrate.

In a preferred embodiment, the packaging device further comprises a plurality of stems extending from the circuit board. Wherein, the stems are electrically connected to the first or second electrode area.

BRIEF DESCRIPTION OF THE DRAWINGS

The invention as well as a preferred mode of use, further objectives, and advantages thereof will be best understood by referring to the following detailed description of three preferred embodiments in conjunction with the accompanying drawings, wherein.

DETAILED DESCRIPTION OF PREFERRED EMBODIMENTS

Figure 1:
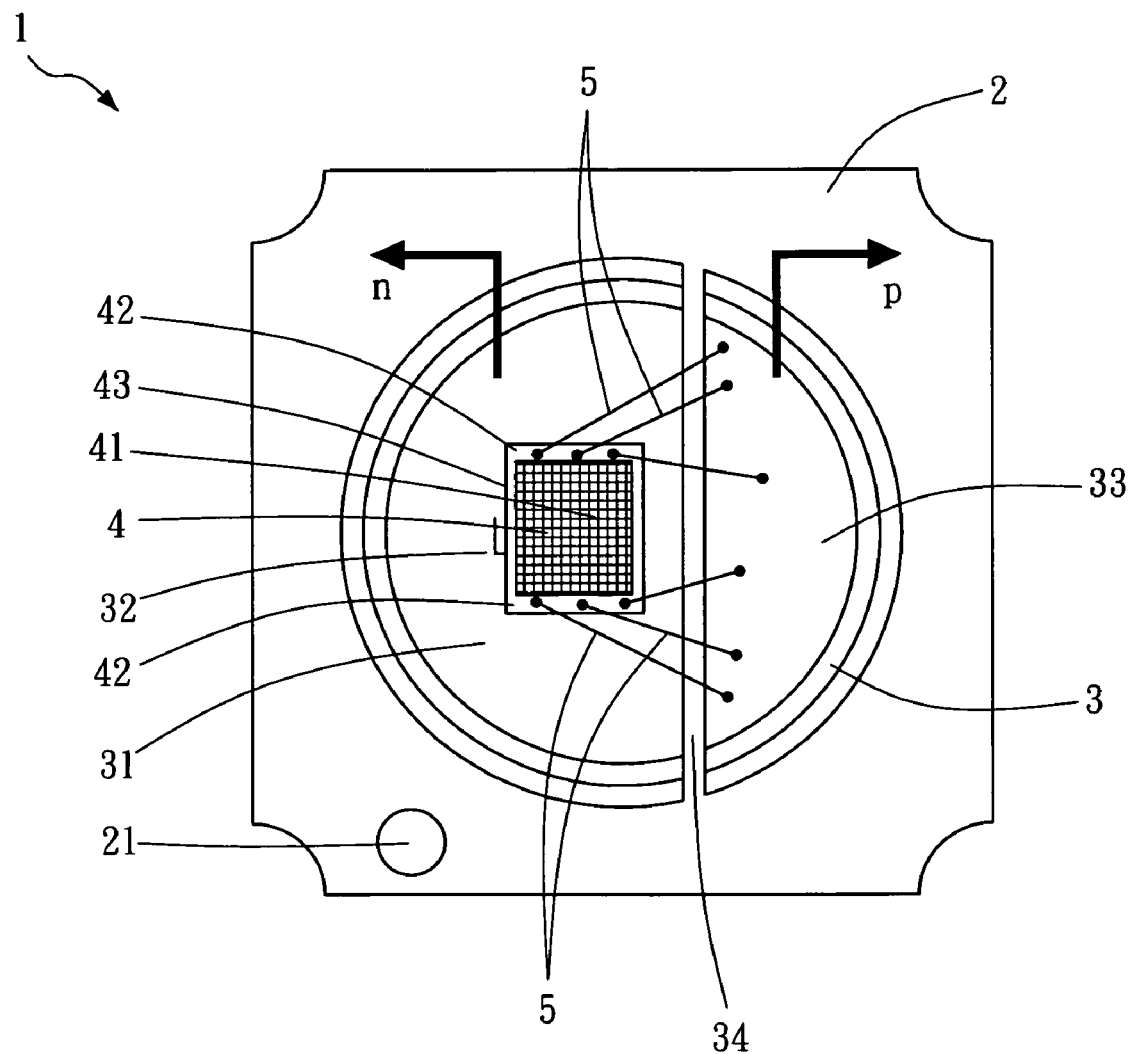
FIG. 1 is a top view of a first embodiment of the packaging device for matrix-arrayed semiconductor light emitting elements of high power and high directivity according to the present invention.

FIG. 1 is a top view of a first embodiment of the packaging device for matrix-arrayed semiconductor light-emitting elements of high power and high directivity according to the present invention. In the first embodiment, the packaging device 1 comprises a circuit board 2, a metal substrate 3, an array chip 4, and a plurality of metal wires 5.

The circuit board 2 is used to carry the metal substrate 3, and leads, stems, pins or terminals (not shown in FIG. 1) capable for electrical connection to external printed circuit boards (not shown) are disposed below or laterally to the circuit board 2, wherein at least one hole 21 is disposed on the circuit board 2. In this embodiment, the circuit board 2 may preferably be an LTCC (Low Temperature Co-fired) substrate, an HTCC (High Temperature Co-fired Ceramic) substrate, or a plastic substrate.

The metal substrate 3 adhered to the circuit board 2 has a supporting surface 31 for supporting elements such as the array chip 4 and metal wires 5. On the supporting surface 31 are disposed a first electrode area 32 and at least one second electrode area 33, where as shown in the first embodiment in FIG. 1, the number of the first electrode 32 and the second electrode 33 is respectively one; furthermore, the width of the second electrode area 33 as shown in the top-down direction in FIG. 1 is larger than the width of the array chip 4. The first electrode area 32 and the at least one second electrode area 33 are electrically isolated by an insulating structure 34. In the first embodiment, the metal substrate 3 is comprised of copper, aluminum, gold, copper alloy, aluminum alloy, or gold alloy, and the first and second electrode areas 32, 33 on the surface of metal substrate 3 may be selectively formed of a layer of silver, copper, gold or the alloy thereof by means of electroplating, printing or deposition process, to improve the electrical conductivity of the area and the adhesive force of wire bonding. The metal substrate 3 fabricated from copper, aluminum, gold or the alloy thereof possesses better heat conducting and dissipating capabilities compared to conventional nickel-iron alloy substrates, and are therefore particular suitable for use in the high power operated packaging device 1 for semiconductor light-emitting elements. The insulating structure may be insulating paint or ceramic, or other insulating materials. In one embodiment, the metal substrate 3 extended from top surface of the circuit board 2 to the bottom surface (back side) of the packaging device 1 for semiconductor light-emitting elements, not only for combination with the printed circuit board (PCB) configuring the packaging device 1, but also for enhanced heat dissipation effects.

The array chip 4 is disposed on the first electrode area 32 of the metal substrate 3. Multiple matrix-arranged semiconductors 41 and at least one wire bonding pad 42 are disposed on an active side of the array chip 4, wherein the light-emitting elements 41 may preferably be of VCSELs, HCSELs or RCLEDs. Furthermore, a conductive adhesive 43 is applied between the bottom surface of the array chip 4 and the first electrode area 32 for electrically connecting the two. In other words, the entire metal substrate 3 becomes the grounded n-electrode due to contact of the first electrode area 32 and the bottom surface of the array chip 4, while only the second electrode 33 becomes the p-electrode. In the first embodiment, the conductive adhesive 43 may preferably be solder paste. The present invention adopts highly heat conductive solder paste as the conductive adhesive 43 to bond the array chip 4 and the first electrode area 32 of metal substrate 3, achieving better heat conducting and dissipating effects as compared to the conventional colloidal silver adhesion method, and is particularly suitable for use in the high power operated packaging device 1 for semiconductor light-emitting elements. In the present invention, the number of the light-emitting elements 41 may be 256 (16×16) with peak power reaching 12-15 watts during pulse operation. The light-emitting elements 41 are arranged as in the form of a polygon, and the number of the wire bonding pads 42 is at least two and on different sides of the polygon. In the embodiment shown in FIG. 1, the light-emitting elements 41 are arranged into a tetragon while the wire bonding pads 42, in the number of two, are settled at two vertically opposite sides of the tetragon. However, in an alternative embodiment, the wire bonding pads 42 may be on the adjacent sides of the tetragon.

The metal wires 5 are connected to the at least one wire bond pad 42 and the at least one second electrode area 33 through a wire bonding process, wherein the metal wire 5 may preferably be gold. In this embodiment, because the width of the second electrode 33 in the top-down direction shown in FIG. 1 is larger than the width of the array chip 4, and the two wire bonding pads 42 are respectively on the opposing sides of the light-emitting elements 41 of the array chip, the wires are extended obliquely outwards from the top and bottom sides of the array chip 4, without traversing over the light-emitting elements 41 or subsequently blocking the light-emitting elements 41 thereof, even if the number of the metal wires 5 is large. Moreover, due to a relatively larger area of the second electrode area 33 adopted in the present invention and top and bottom side distribution of the wire bonding pads 42 on the array chip 4, heat can be more effectively dissipated. Given the structure of the packaging device 1 for matrix-arrayed semiconductor light-emitting elements of high power and high directivity allows for more metal wires 5 to transmit power signals, advantages such as shunted currents, reduced resistance, easy and flexible layout, and reduced heat production, are achieved.

In the other preferred embodiments of the present invention described hereinafter, since most elements are the same as or similar to those in the aforementioned embodiment, like elements will be referred to by like names and numbers, and an extra alphabet will be appended to the original number for similar elements having the same name without any particular mention.

Figure 2:
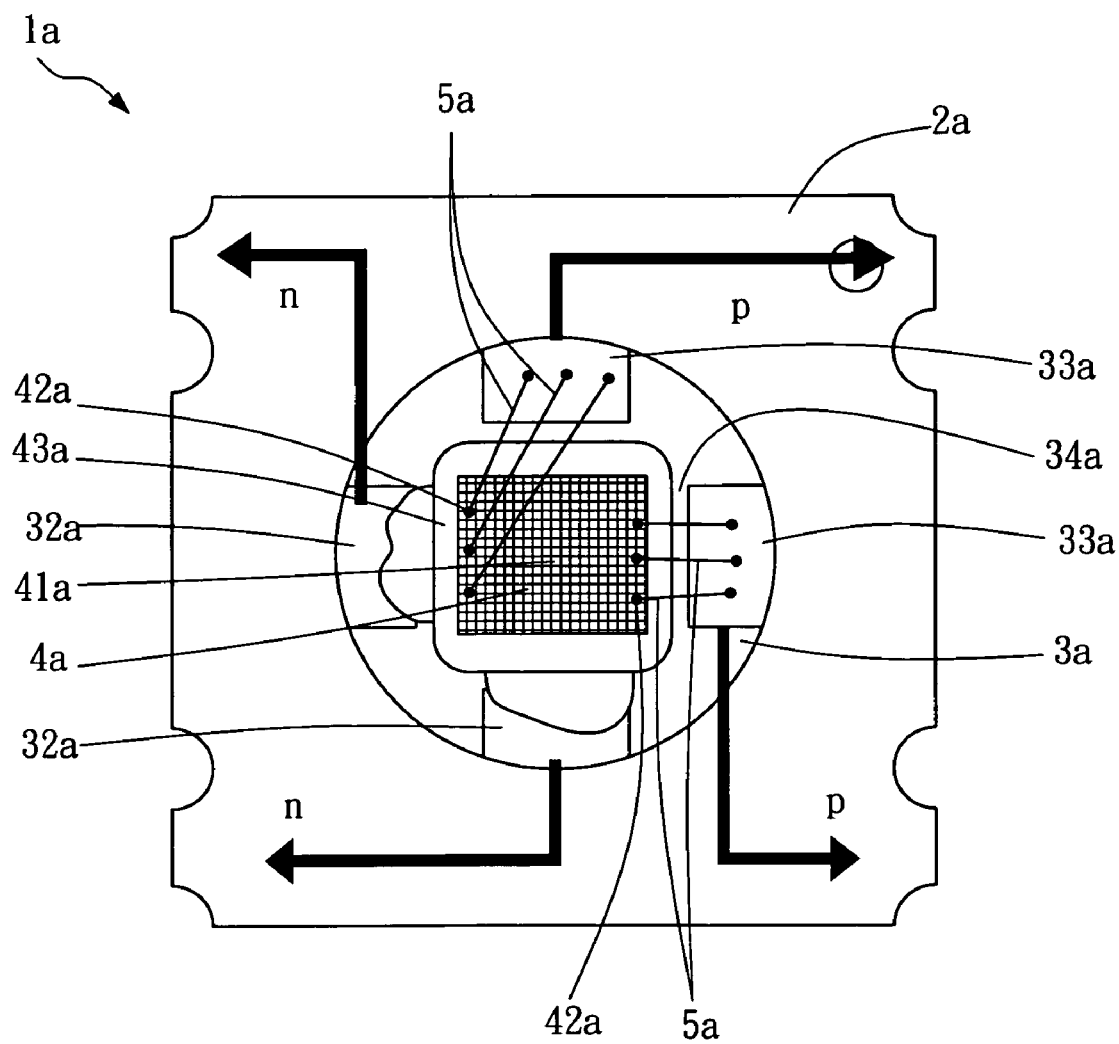
FIG. 2 is a top view of a second embodiment of the packaging device for matrix-arrayed semiconductor light emitting elements of high power and high directivity according to the present invention.

FIG. 2 is a top view of a second embodiment of the packaging device 1a for matrix-arrayed semiconductor light-emitting elements of high power and high directivity according to the present invention. In the second embodiment, the packaging device 1a also comprises a circuit board 2a, a metal substrate 3a, an array chip 4a, and a plurality of metal wires 5a.

The metal substrate 3a adhered to the circuit board 2a has a supporting surface for bearing elements such as the array chip 4a and metal wires 5a. Two first electrode areas 32a (n-electrode) and two second electrode areas 33a (p-electrode) comprised of copper, silver, gold or the alloy thereof, are disposed on the supporting surface by means of printing, electroplating, deposition or adhesion, to serve as the metal pads for wire bonding. In the embodiment shown in FIG. 2, the two electrode areas 32a are located on the left and bottom sides of the array chip 4a, applied with conductive adhesive 43a towards the bottom surface to the array chip 4a, to enhance electrical and heat conducting effects; the two second electrodes 33a are located on the right and top sides of the array chip 4a, isolated from the bottom surface of the array chip 4a by an insulating structure 34a. Multiple matrix-arranged semiconductor light-emitting elements 41a and two wire bond pads 42a on the right and left sides of the light-emitting elements 41a are disposed on the active side of the array chip 4a, forming an approximate correspondence in terms of the locations of the two second electrode areas 33a and the two wire bond pads 42a. The metal wires 5a are connected between the two wire bond areas 42a and the closer second electrode area 33a through wire bonding process. In this embodiment, because the wire bond area 42a left of the light-emitting element 41a and the second electrode area 33a top of the array chip 4a are not adjacent, some of the metal wires 5 inevitably transverse over some of the light-emitting elements 41a. But since the light-emitting elements 41a of the present invention are of the "high directivity" type such as of VCSELs, HCSELs or RCLEDs, the angle of emergence is smaller and thus less likely to be blocked by the metal wires 5a. Therefore, the structure of the present invention is particular suitable for use in the packaging device 1a for matrix-arrayed semiconductor light-emitting elements of high power and high directivity.

Figure 3:
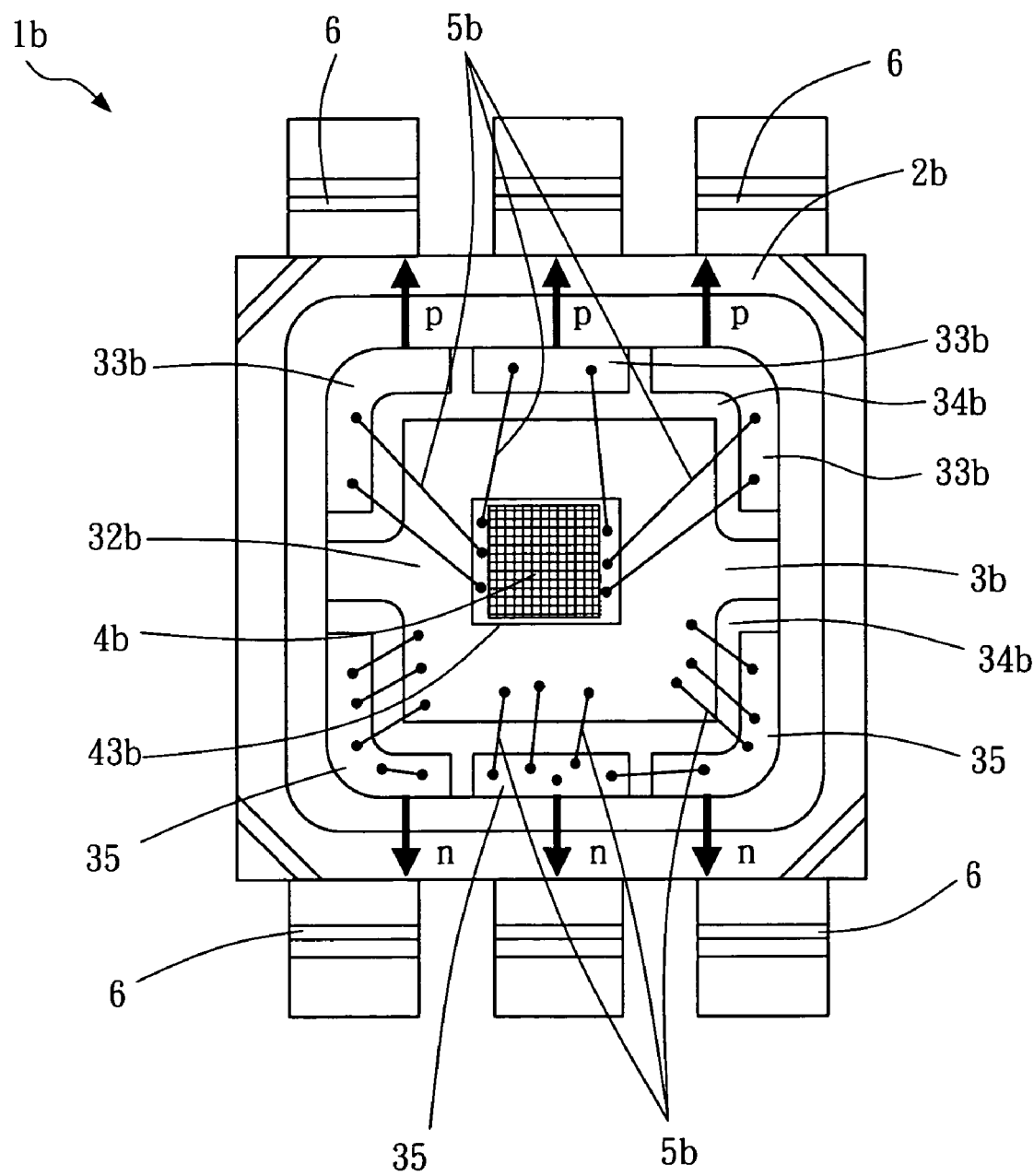
FIG. 3 is a top view of a third embodiment of the packaging device for matrix-arrayed semiconductor light emitting elements of high power and high directivity according to the present invention.

FIG. 3 is a top view of a third embodiment of the packaging device 1b for matrix-arrayed semiconductor light-emitting elements of high power and high directivity according to the present invention. In the third embodiment, the packaging device 1b also comprises a circuit board 2b, a metal substrate 3b, an array chip 4b, and a plurality of metal wires 5b.

The metal substrate 3b adhered to the circuit board 2b has a supporting surface for bearing elements such as the array chip 4b and metal wires 5b. In the embodiment shown in FIG. 3, a first electrode area 32b (n-electrode), three second electrodes 33b (p-electrode), and three third electrode areas 35 (n-electrode) are disposed on the metal substrate 3b. The first electrode area 32b is in contact with the bottom surface of the array chip 4b and has larger area than the array chip 4b does, with conductive adhesive 43b also applied towards the bottom surface of the array chip 4b to enhance the electrical and heat conducting effects; the three second electrode areas 33b are located respectively on the top-left, top and top-right sides of the array chip 4b, isolated from the bottom surface of the array chip 4b, the first electrode 32b and the third electrode areas 35 by an insulating structure 34b. The two second electrodes 33b on the top-left and top-right sides of the array chip 4b are L-shaped and corresponding to the corners of the array chip 4b, for increasing the ease and flexibility of the wire bonding process and preventing the metal wires 5b from traversing over the array chip 4b. The three third electrodes 35 are located respectively on the bottom-left, bottom and bottom-right sides of the array chip 4b, all electrically connected to the first electrode area 32b and each of the third electrode areas 35 through wire bonding process. The two third electrodes 35 on the bottom-left and bottom-right sides of the array chip 4b are L-shaped and corresponding to the corners of the array chip 4b. In the embodiment in FIG. 3, the packaging device 1b further comprises a plurality of leads 6 extending from the circuit board 2b, wherein the leads 6 are electrically connected to the first or second electrode areas 32b, 33b, respectively. Through the use of this leads 6 structure, the packaging device 1b for matrix-arrayed semiconductor light-emitting elements of high power and high directivity of the present invention may be employed in surface mount devices (SMDs).

The present invention has been described with preferred embodiments thereof, and it is understood that many changes and modifications to the described embodiment can be carried out without departing from the scope and the spirit of the invention that is intended to be limited only by the appended claims.

What is claimed is:

1. A packaging device for matrix-arrayed semiconductor light-emitting elements of high power and high directivity, the packaging device comprising:
   a metal base having a supporting surface with a first electrode area and at least one second electrode area disposed thereon, said first electrode area and said at least one second electrode area being electrically isolated via an insulating structure;
   an array chip disposed on said first electrode area, wherein a plurality of matrix-arranged semiconductor light-emitting elements and at least one wire bond pad adjacent to said light-emitting elements are disposed on an active side of said array chip, wherein said light-emitting elements are arranged as a tetragon and the number of said wire bond pads is at least two and distributed on different sides of said tetragon; and
   a plurality of metal wires connected between said at least one wire bond pad and said at least one second electrode area;
   wherein at least one second electrode area among said second electrode areas is an L-shaped structure located at a corner of said array chip.

2. The packaging device of claim 1, wherein said light-emitting element is chosen from one of the following: VCSEL element, an HCSEL element and an RCLED element; in addition, a material of said metal base is chosen from one of the following: copper, aluminum, gold and an alloy of either copper, aluminum or gold.

3. The packaging device of claim 2, wherein a conductive adhesive is applied between a bottom surface and said first electrode area for bonding, facilitating an electrical connection between said bottom surface and said first electrode area; wherein said conductive adhesive is solder paste.

4. The packaging device of claim 1, wherein the number of said second electrode area is at least two and corresponds in position to said wire bond pads.

5. The packaging device of claim 1, wherein at least one third electrode area is further disposed on said metal base.

6. The packaging device of claim 5, wherein the number of said at least one third electrode area is at least two, and at least one thereof is an L-shaped structure located at a corner of said array chip while said third electrode areas and said first electrode area are electrically connected via a plurality of metal wires.

7. The packaging device of claim 1, further comprising a circuit board, said metal base being embedded on said circuit board, and said circuit board being an LTCC substrate, an HTCC substrate or a plastic substrate.

8. The packaging device of claim 7, further comprising a plurality of stems extending from said circuit board, said stems being electrically connected to said first or second electrode area.

9. A packaging device for matrix-arrayed semiconductor light-emitting elements of high power and high directivity, the packaging device comprising:
   a metal base having a supporting surface with a first electrode area and at least one second electrode area disposed thereon, said first electrode area and said at least one second electrode area being electrically isolated via an insulating structure;
   an array chip disposed on said first electrode area, wherein a plurality of matrix-arranged semiconductor light-emitting elements and at least one wire bond pad adjacent to said light-emitting elements are disposed on an active side of said array chip, wherein said light-emitting elements are arranged as a tetragon and the number of said wire bond pads is at least two and distributed on different sides of said tetragon;
a conductive adhesive applied between a bottom surface of said array chip and said first electrode area, facilitating an electrical connection between said bottom surface and said first electrode area; and
a plurality of metal wires connected between said at least one wire bond pad and said at least one second electrode area,
wherein said light-emitting elements are chosen from one of the following: VCSEL elements, HCSEL elements and RCLED elements, and
wherein at least one second electrode area among said second electrode areas is an L-shaped structure located at a corner of said array chip.

10. The packaging device of claim 9, wherein a material of said metal base is chosen from one of the following: copper, aluminum, gold and an alloy of either copper, aluminum or gold.

11. The packaging device of claim 9, wherein said conductive adhesive is solder paste.

12. The packaging device of claim 9, wherein the number of said second electrode area is at least two and corresponds in position to said wire bond pads.

13. The packaging device of claim 9, wherein at least one third electrode area is further disposed on said metal base; wherein the number of said at least one third electrode area is at least two, and at least one thereof is an L-shaped structure located at a corner of said array chip while said third electrode areas and said first electrode area are electrically connected via a plurality of metal wires.

14. The packaging device of claim 9, further comprising a circuit board and a plurality of stems; said metal base being embedded on said circuit board and being an LTCC substrate, an HTCC substrate or a plastic substrate; said stems extending from said circuit board and being electrically connected to said first or second electrode area.

* * * * *